United States Patent
Schaefer et al.

Patent Number: 5,402,357
Date of Patent: Mar. 28, 1995

[54] SYSTEM AND METHOD FOR SYNTHESIZING LOGIC CIRCUITS WITH TIMING CONSTRAINTS

[75] Inventors: Thomas J. Schaefer, Cupertino; Robert D. Shur, Los Altos, both of Calif.

[73] Assignee: VLSI Technology, Inc., San Jose, Calif.

[21] Appl. No.: 801,793

[22] Filed: Dec. 2, 1991

Related U.S. Application Data

[63] Continuation-in-part of Ser. No. 631,600, Dec. 20, 1990, Pat. No. 5,197,015.

[51] Int. Cl.[6] ............................................. G06F 15/60
[52] U.S. Cl. .................................. 364/490; 364/489; 364/488
[58] Field of Search ............... 364/488, 489, 490, 491

[56] References Cited

U.S. PATENT DOCUMENTS

| | | | |
|---|---|---|---|
| 4,967,367 | 10/1990 | Piednoir | 364/489 |
| 5,077,676 | 12/1991 | Johnson et al. | 364/489 |
| 5,210,700 | 5/1993 | Tom | 364/489 |
| 5,218,551 | 6/1993 | Agrawal et al. | 364/489 |

OTHER PUBLICATIONS

"Circuit Placement for Predictable Performance" by Hange et al., IEEE International Conf. on Computer Aided Design, ICCAD-87, pp. 88-91, 1987.
"Analytical Power/Timing Optimization Technique for Digital System" by Ruehli et al., IEEE 14th Design Automation Conf., 1977, pp. 142-146.
"Timing Analysis for nMOS VLSI" by N. P. Jouppi, IEEE 20th Design Automation Conf., 1983, pp. 411-418.
"Timing Influenced Layout Design" by Burstein et al., IEEE 22nd Design Automation Conf., 1985, pp. 124-130.

*Primary Examiner*—Vincent N. Trans
*Attorney, Agent, or Firm*—Flehr, Hohbach, Test, Albritton & Herbert

[57] ABSTRACT

In a computer aided design system, a netlist specifies the integrated circuit's components and a set of interconnecting nodes. Also provided are a set of timing constraints for propagation of signals from specified input nodes to specified output nodes, and a set of signal delays associated with the circuit's components. The automatic circuit layout synthesis process begins by assigning an initial capacitance value to each node. Next, a routing difficulty value is computed, this value comprises a sum of routing difficulty values associated with each of the nodes in the integrated circuit. Capacitance values for the integrated circuit are then adjusted so as to reduce the computed routing difficulty. Finally, the netlist and adjusted capacitance values are passed to a silicon compiler for automatic placement and routing of a circuit having capacitance values not exceeding the adjusted capacitance values.

10 Claims, 3 Drawing Sheets

SYSTEM AND METHOD FOR SYNTHESIZING LOGIC CIRCUITS WITH TIMING CONSTRAINTS

This is a continuation-in-part of Ser. No. 07/631,600, filed Dec. 20, 1990, now U.S. Pat. No. 5,197,015.

The present invention relates generally to computer aided design systems which facilitate the design of integrated circuits and particularly to computer aided design methods and systems for setting constraints on the capacitance of each node of a specified integrated circuit prior to routing connections between the components of that circuit.

BACKGROUND OF THE INVENTION

Virtually all complex integrated circuits are designed with the use of computer aided design (CAD) tools. Some CAD tools, called simulators, help the circuit designer verify the operation of a proposed circuit. Another type of CAD tool, called a silicon compiler (also sometimes known as automatic layout or place and route systems), generates the semiconductor mask patterns from a detailed circuit specification. One task that must be performed by a silicon compiler is that it must route connections between the components of the circuit. Such components are often called cells.

Netlists

The detailed circuit specification used by silicon compilers and circuit simulators is often called a netlist, and comprises a list of circuit components and the interconnections between those components. A short netlist for a simple circuit is shown in Table 1.

TABLE 1

| Cell Name | Input Signals 1 | Input Signals 2 | Output Signals 1 | Output Signals 2 |
|---|---|---|---|---|
| XOR | A | B | C | |
| XOR | C | CN1 | Y | |
| AND | A | B | CA | |
| AND | C | CN1 | CB | |
| NOR | CB | CA | CN | |

The netlist defines all of the interconnections between the components of the circuit. Each "signal" which interconnects two or more cells, or which represents an input or output for the entire circuit, is actually a node in the circuit which has been assigned a name. Thus the terms "signal" and "node" are often used interchangeably.

In the exemplary netlist shown in Table 1, signals A, B and CN1 are input nodes to the entire circuit, Y and CN are output nodes for the entire circuit, and nodes C, CA and CB are internal nodes.

In addition, the netlist specifies the nature of its components by specifying a cell name for each component. The cell name, in turn, specifies or points to a particular circuit in a predefined library of cells.

Silicon Compiling Using Capacitance Constraints

The problem that the present invention solves is as follows. An integrated circuit may have specified timing constraints, which define the maximum allowable amount of time that may take a particular set of input signals to generate output signals on specified output nodes of the circuit. Further, while designing the layout of an integrated circuit there is a tradeoff between the capacitive load on the nodes of the circuit and the difficulty of laying out the circuit. In particular, the capacitance of a node is proportional to the length of that node's connecting lines. Thus, the lower the maximum allowed capacitance on each node of the circuit, the more difficult it is to design or lay out that circuit—because a low node capacitance limits the length of the node's connectors and forces the components coupled to that node to be positioned close to one another.

The capacitive load on each node of the circuit limits the speed with which signal can propagate through that circuit. For instance, if C1 is the capacitance on node CN1 of a circuit, and the component driving node CN1 has a "drive strength" of S, then the timing delay associated with node CN1 is $$\frac{C1}{S}.$$

The present invention concerns a new type of computer aided design tool—one which helps circuit designers determine the maximum amount of capacitance that should be allowed for each node of a specified circuit. In particular, the present invention provides a system and method for specifying the best possible set of maximum capacitance values for the nodes of circuit. These capacitance values must be consistent with the timing constraints on the circuit, and are selected so as to minimize a "layout difficulty" function which corresponds to the difficulty of designing or laying out a circuit with any given set of capacitive loading constraints. Referring to FIG. 1, the present invention fills a niche in computer aided design systems which has heretofore remained a task requiring human intervention and engineering expertise. In particular, when designing an integrated circuit using computer aided design (CAD) tools, especially a logic circuit, a netlist 100 representing the particular components is either generated by a logic synthesizer 102 from a logic specification 104 (i.e., a set of boolean equations), or is prepared by an engineer. Logic synthesizers are known in the art, one such system is the VLSI State Machine Compiler, Version 8, Release 1, by VLSI Technology, Inc., San Jose, Calif.

If the netlist 100 is provided to a silicon compiler 110 or routing program with no limitations on the capacitance of the circuit's nodes, it is quite possible that the resulting circuit layout will not meet the timing requirements for the circuit. As a result, engineers typically specify a set of maximum capacitive loads 114 for at least those nodes on certain critical paths of the circuit. These capacitive loads are then tested using a timing verifier (sometimes called a logic timing analyzer) 112 so as to ensure that a circuit having nodes with the specified capacitive loads will meet the required timing constraints.

The maximum capacitive loads specified by engineers are often selected based on experience, hunches, and a little bit of calculation based on perceived timing needs at certain critical points of the circuit. In general, it is virtually impossible to accurately compute a set of capacitive constraints by hand. Further, the prior art does not provide a method for selecting the best such set of constraints.

Unlike the partially automated prior art computer aided design systems represented by FIG. 1, the present invention provides a completely automated design system that generates a circuit layout for a specified circuit netlist that will meet a specified set of timing constraints. To do this, the system computes an optimal, or nearly optimal, set of maximum capacitance values for each of the nodes in a specified circuit and passes those capacitance values as a set of capacitive constraints to a silicon compiler which then places the specified circuit's components and routes connections therebetween consistent with those capacitive constraints.

SUMMARY OF THE INVENTION

In a computer aided design system, capacitative constraints are defined for the nodes of an integrated circuit. A netlist specifies the integrated circuit's components and a set of interconnecting nodes. Also provided are a set of timing constraints for propagation of signals from specified input nodes to specified output nodes, and a set of signal delays associated with the circuit's components. The automated circuit layout synthesis process begins by assigning an initial capacitance value to each node. Next, a routing difficulty value is computed, this value comprises a sum of routing difficulty values associated with each of the nodes in the integrated circuit. Capacitance values for the integrated circuit are then adjusted so as to reduce the computed routing difficulty. Finally, the netlist and adjusted capacitance values are passed to a silicon compiler for automatic placement and routing of a circuit having capacitance values not exceeding the adjusted capacitance values.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
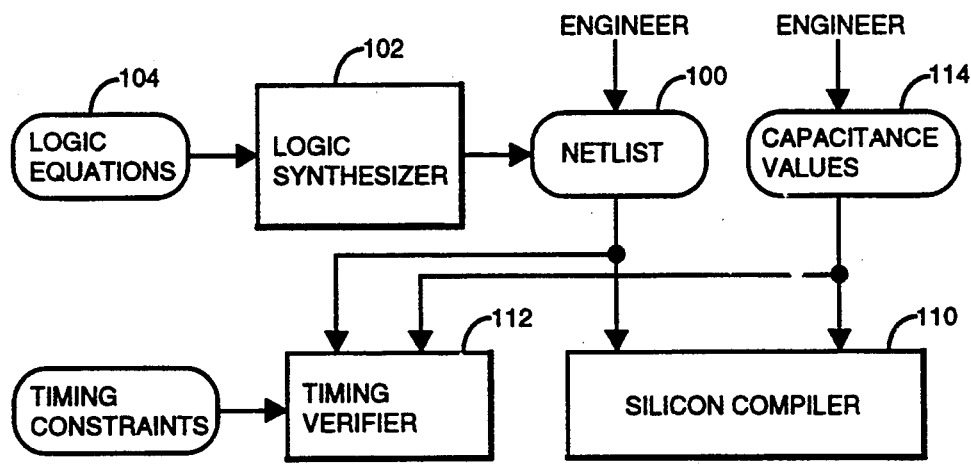
FIG. 1 is a block diagram of a prior art computer aided circuit design system.
Figure 2:
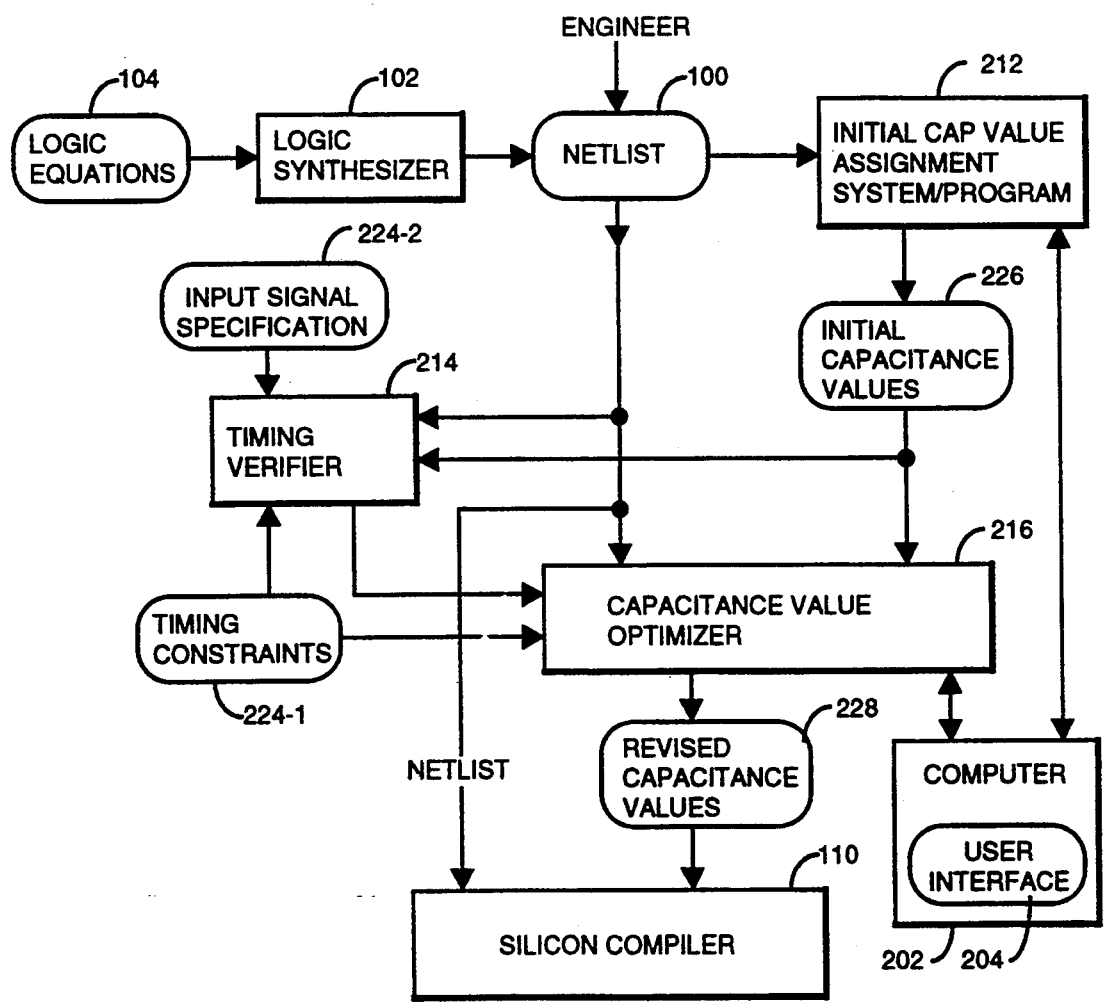
FIG. 2 is a conceptual block diagram of a computer aided circuit design system in accordance with the present invention.
Figure 3:
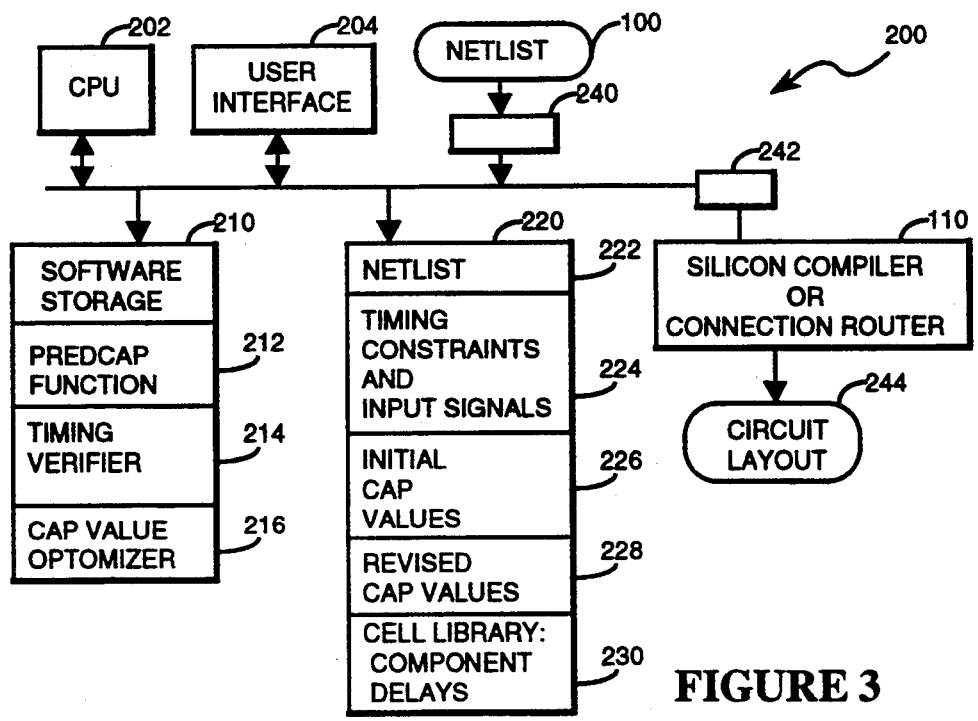
FIG. 3 depicts a preferred embodiment of a system for generating a set of capacitive loading constraints for a specified circuit.

Referring to FIGS. 2 and 3, the preferred embodiment is implemented on a computer workstation 200 having a CPU 202, a user interface 204, disk or other memory storage 210 for storing software modules 212–216, random access memory 220 for storing arrays of data 222–230, and input/output ports 240 and 242. Data such as the netlist, timing constraints, input signals specifications and the like may be entered either through port 240 or through the user interface 204. When the capacitance values for the specified circuit have been determined, they are transmitted via port 242 to a silicon compiler or connection routing program 110.

The software modules stored in memory 210 include a "PREDCAP" function 212, a timing verifier program 214, and a netlist capacitance optimizer 216. The timing verifier program 214 may be any one of many commercially available systems, including the VLSI Timing Verifier, Version 8, Release 1, from VLSI Technology, Inc., San Jose, Calif.

The PREDCAP function 212 computes a "predicted capacitance" for any specified node of a circuit, using the following formula:

$$PREDCAP(i) = (FANOUT_i) \times C1 + C2 \qquad (Eq. 1)$$

where $FANOUT_i$ is the number of component input ports that are coupled to a particular circuit node, herein identified by index value i, C2 is the predicted or average capacitance associated with a node that connects to only one component input port, and C1 is the predicated or average capacitance associated with each additional input port connection. Note that C1 and C2 are parameters that can be adjusted to fit the particular manufacturing process and circuit design rules being used. The PREDCAP function is designed to compute an "average" capacitance value for a node having a specified fanout. In actuality, the capacitance of each node will depend on how far apart the various components are placed, whether the node needs to be routed around any obstacles, such as a crowded region of the circuit, and so on. In addition, this function also computes a corresponding time delay value for each node i:

$$TIME\_DELAY(i) = \frac{PREDCAP(i)}{S(Driving\ Component)} \qquad (Eq. 2)$$

where S is the "drive strength" of the component which generates the signals transmitted via i.

The timing verifier/timing analyzer program 214 can be any logic simulation program which simulates the operation of a specified logic circuit and produces a listing of state transitions for specified output signals that can be compared with a set of specified timing constraints. The logic simulation program delays the propagation of signals pursuant to specified component delay times and also pursuant to specified transmission delay times for each node of the circuit. These are all standard features of state of the art logic simulation programs, and thus do not need to be described herein. What is needed from the timing verifier is sufficient data on the timing of output signals to be able to compare the timing of those signals with specified timing constraints for the circuit. Alternately, program 214 can be a timing analyzer program, the only function of which is to analyze time delays in a specified circuit.

The capacitance value optimizer 216 is a program for adjusting the capacitances assigned to each node of a specified circuit so as to (1) meet the timing constraints on the circuit, and (2) make it as easy as possible for the silicon compiler 110 to lay out the circuit. The silicon compiler generates a circuit layout 44 corresponding to the netlist 100, with circuit nodes that do not exceed the maximum capacitance values generated by the capacitance value optimizer 216. The silicon compiler 110 may be any one of many commercially available systems including the VLSI Chip Compiler, Version 8, Release 1 by VLSI Technology, Inc., San Jose, Calif. It is known in the art and the VLSI Chip Compiler, in particular, provides the ability to set a maximum capacitance value for a net. Subsequently, the silicon compiler attempts to meet the specified capacitance constraint by dynamically adjusting the net weights of selected nets.

Array 222 stores the netlist 100 which represents the circuit being worked on. Array 224 stores the set of timing constraints and the corresponding input signal specification, which together define the maximum time delays allowed between inputs to the circuit on its input nodes, and output signals on the circuit's output nodes. Array 226 stores a set of initial capacitance values assigned to the circuit's nodes using the PREDCAP function 212. Array 228 stores revised capacitance values computed by the capacitance value optimizer 216. Finally, array 230 stores delay times associated with the operation of each of the components used in the circuit. Typically, array 230 stores such delay time data for all the cells (i.e., component circuits) in a cell library (which is the set of all circuit components) available for use in specified circuits using the system 200.

The cell library stored in array 230 also stores a drive strength parameter S for each component's output ports.

Figure 4A:
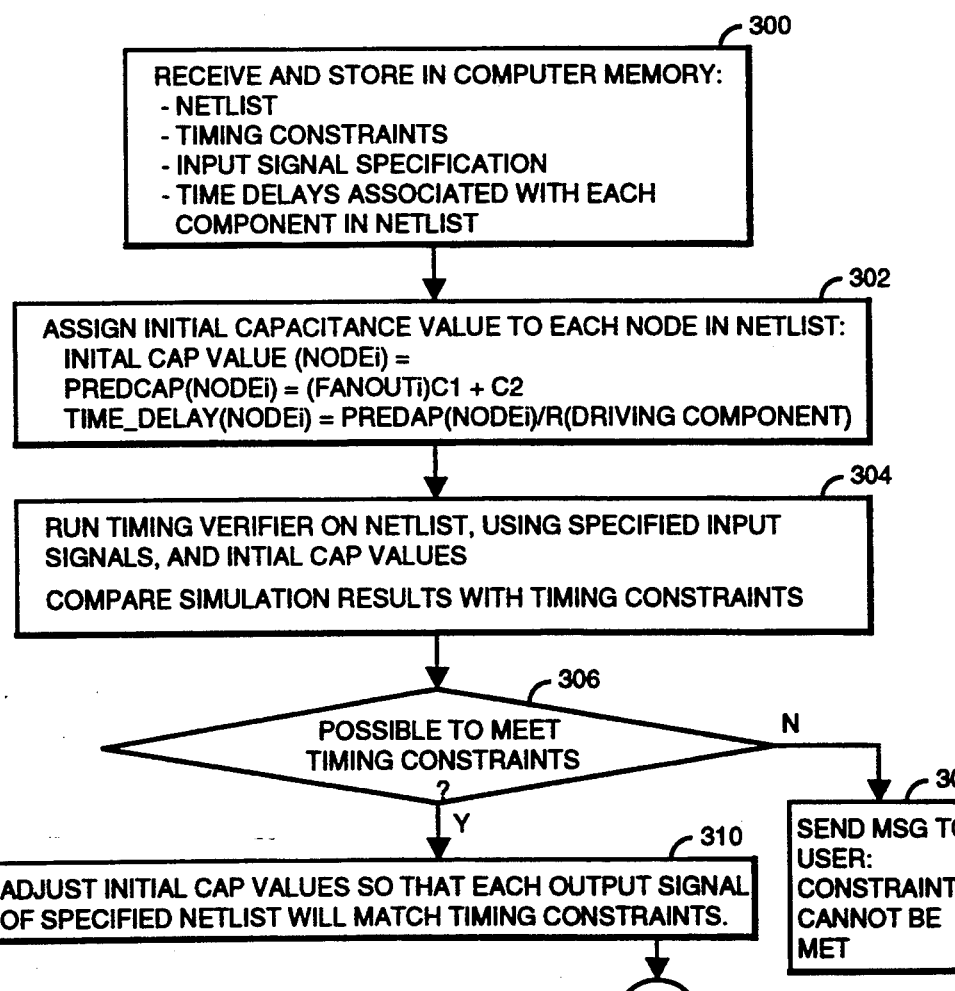
FIGS. 4A and 4B are flow chart of the preferred embodiment of a method for generating a set of capacitive loading constraints for a specified circuit.

FIG. 2 shows the logical relationships between all the system components described above with respect to FIG. 3. Referring to FIGS. 2 and 4, the preferred embodiment of the invention works as follows. As in the prior art, the first steps are to generate a circuit specification, in the form of a netlist 100, and a set of timing constraints and corresponding input signal specifications for testing the circuit's ability to meet those timing constraints. At this point, the present invention departs from the practices of the prior art.

The above described starting data, as well as time delay data for each of the components in the circuit, is stored in the memory of a computer (step 300), and then the PREDCAP function described above is executed for every node of the specified circuit (step 302). This generates an initial capacitance value and a corresponding time delay value, both of which are stored in array 226, for each node of the circuit. Next, operation of the specified circuit with the computed node capacitance values (or the equivalent node time delays) is simulated with a timing verifier, and the results of that simulation are compared with the timing constraints (step 304). For instance, the timing constraints may include a requirement that the circuit must produce a particular output signal on node X no more than, say, thirty nanoseconds after a particular input signal is asserted on node Y. The actual time delay between those two events for the specified circuit is determined using the timing verifier, and then compared with the timing constraint.

Next, the process determines if it is possible to meet the specified timing constraints for the circuit (step 306). If the specified circuit with the initial capacitance value meets every time constraint, then it is clearly possible for the circuit to meet the specified timing constraints. If one or more of the timing constraints are not met, each such failure is inspected to determine whether the fixed timing delays associated with the corresponding circuit components in the "critical path" for that timing constraint exceed the time allowed (i.e., if a timing constraint cannot be met even with zero capacitance on all nodes, then the constraint is inherently unmeetable). If so, then it is impossible to meet the timing constraints and the user of the system is sent a message that the timing constraints cannot be met (step 308) and then the entire CAD process stops until such time that the user changes the circuit or the timing constraints and then restarts the computer aided design process.

Otherwise, even if some timing constraints were not met by the initial logic simulation, the timing constraints could possibly be met if capacitances on some of the circuit's nodes were reduced. More generally, all of the initially assigned capacitance values within each such critical path are scaled up or down so that each critical path in the circuit matches the timing constraints specified for the circuit (step 310). In the preferred embodiment, steps 306–310 are performed by a timing verifier modified to adjust the initial capacitance values and to retest against timing constraints until a set of "initial" capacitance values is obtained that is consistent with the circuit's timing constraints.

The idea at step 310 is to assign the largest possible node capacitance values, consistent with the timing constraints, so as to give the silicon compiler as much freedom as possible to route the specified connections between the circuit's components. However, this initial, adjusted set of capacitance values is assigned in a very arbitrary fashion, simply by assigning capacitance values using an arbitrary function and uniformly adjusting groups of those values up or down so as to meet certain timing requirements. The inventors have found that these initial adjusted capacitance values can usually be improved upon quite substantially, resulting in a set of maximum node capacitance values that make the circuit much easier to lay out.

It may be noted that the test in steps 306 through 310 can be performed in a different and perhaps easier fashion. In particular, one could first simulate the circuit with the assumption that there are no time delays whatsoever associated with the circuit's nodes. Then, if any timing constraints for the circuit are not met, it is not possible to select a set of node capacitance values that will enable the circuit to meet those timing constraints. If the output signals from this initial circuit simulation meet the circuit's timing constraints, then a second simulation of the circuit would be performed using a set of more realistic initial capacitance values.

Figure 4B:
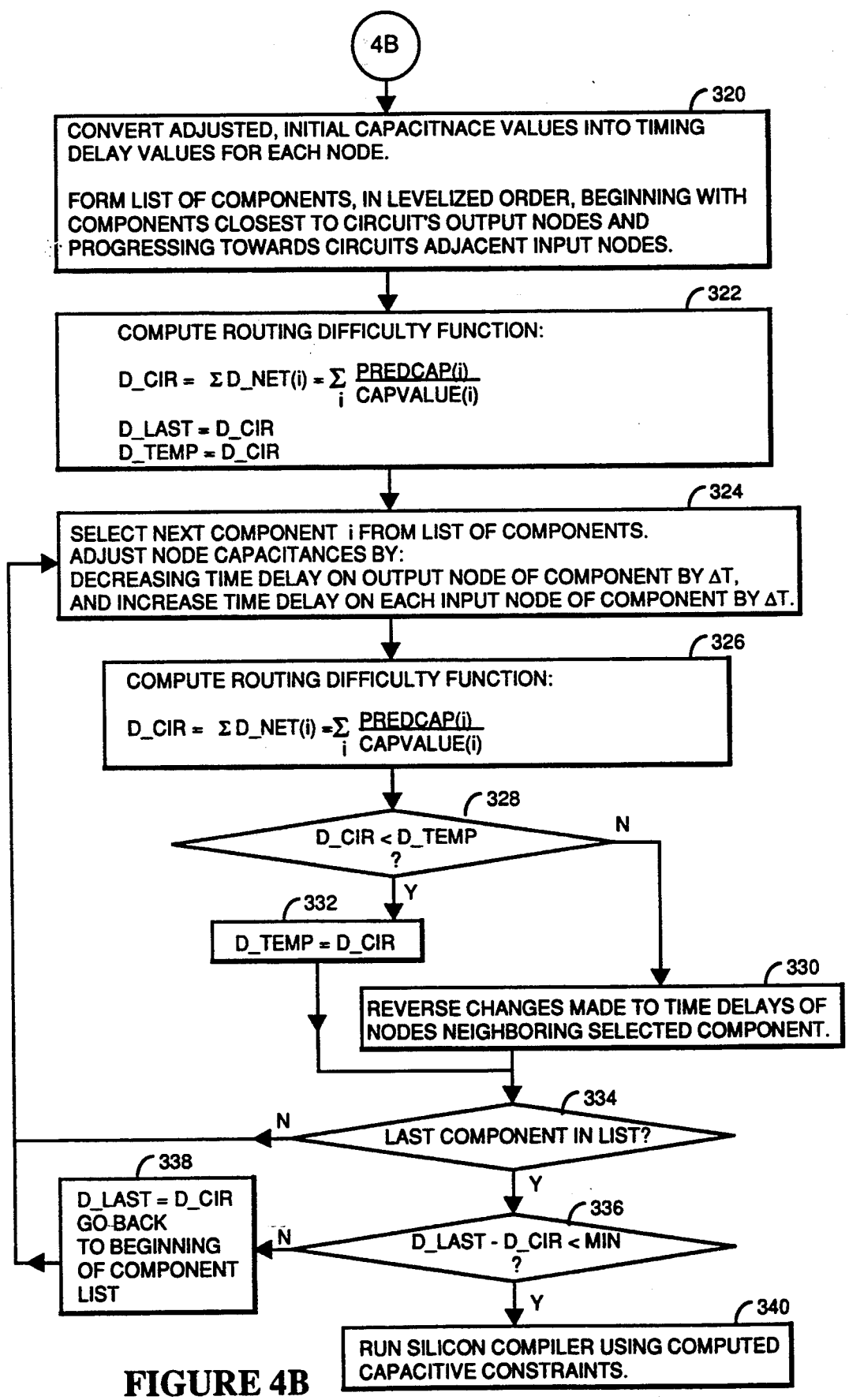

Turning now to FIG. 4B, we have a set of initial capacitance values, which have been adjusted as in step 310. Next, the capacitance value optimizer program converts those values into timing delay values, in accordance with equation 2 above. In addition, it forms a list of the specified circuit's components in levelized order, beginning with components closest to the circuit's output nodes and progressing toward the circuit's input nodes (step 320). Whenever possible, the initial netlist provided to the capacitance value optimizer program should already list the circuit's components in levelized order, making the second portion of step 320 unnecessary.

Before beginning the main capacitance value adjustment loop, the system first computes a "routing difficulty" value D_CIR for the entire circuit:

$$D\_CIR = \sum_i D\_NET(i) = \sum_i \frac{PREDCAP(i)}{CAPVALUE(i)} \qquad \text{(Eq. 3)}$$

which represents the relative difficulty of laying out the specified circuit for a given set of node capacitance values CAPVALUE(i). This is a "relative" difficulty function in that it computes a value relative to the difficulty of laying out the circuit when the assigned node capacitances are determined by the PREDCAP function. The process then stores this computed value D_CI R in two temporary variables, D_LAST and D_TEMP (step 322), both of which will be used for comparison purposes later on in the process.

Next we begin the main capacitance adjustment loop at step 324, where the "next" component in the ordered netlist is selected, and a certain increment of time delay is shifted from the outputs of that component to the inputs of the component. In other words, the time delay for the output nodes of the component are decreased by a value of ΔT and the time delay for its input nodes is increased by the same amount. This keeps the total time delay for any signal path unchanged. Time delays are "shifted" in this manner by adjusting the capacitances on each of the affected nodes so as to produce the desired amount of change in the time delays for those nodes.

The idea behind shifting time delays from the outputs of a component to its inputs, and generally from the outputs of the entire circuit toward its inputs, is as follows. Most circuit components have more inputs than outputs. Therefore if time delays can be shifted from a circuit's output node to its input nodes, the D_NET value (i.e., the difficulty of layout value) for one or two output nodes will be increased while the $D_{13}$ NET value for each of a larger number of nodes will be decreased by a similar amount. As a result, the overall value of D_CIR is likely to decrease —resulting in a circuit specification that is easier to lay out while still meeting the circuit's timing requirements.

After shifting time delay from a component's output nodes to it's input nodes, the routing difficulty function D_CIR is recomputed in accordance with equation 2 above (step 326) and the new D_CIR value is compared with the previous D_CIR value, called D_TEMP (step 328). If the new D_CIR value is greater than or equal to its previous value, then the time delay shift in step 324 was not beneficial (it did not make it easier to lay out the circuit) and the change made in step 324 is reversed or canceled (step 330). On the other hand, if the new D_CIR value is lower than its previous value, then the shift in time delay has reduced the difficulty of laying out the specified circuit, and thus this shift in capacitance will be retained, in which case the value of D_CIR is stored as D_TEMP (step 332).

Next, the program checks to see if there are any more components in the circuit's netlist (step 334). If so, the loop of steps beginning at step 324 repeats. Otherwise, if the last component in the netlist has just been processed, the optimization program next checks to see how much D_CIR has been decreased during the last sweep through all the components of the netlist (step 336). In other words, after each cycle of processing all the circuit's components with steps 324 through 334, the process checks to see whether D_CIR has converged on or has come close to some minimum value. If so, the capacitance optimization process is complete, and the adjusted capacitance values are passed, along with the circuit netlist, to the silicon compiler for generating a set of circuit masks (step 340).

Otherwise, (i.e., if D_CIR has not yet converged) the value of D_CIR is stored as D_LAST at step 338, and then the entire process restarts with the first component of the ordered netlist at step 324. Thus, the above-described process continues shifting time delays and capacitance values until the difficulty of laying out the circuit, as measured by the D_CIR function, has either been minimized or has reached a value close to its minimum.

It should be noted that the amount of time delay ΔT shifted at step 324 may be selected in a number of different ways. For instance, ΔT could be a predefined constant value, or it could be set to a value such as ten percent of the current time delay value on a components output node. Another technique used by the inventors has been to try a range of ΔT values and then pick the best one. Furthermore, the value of ΔT could be decreased each time that the process does a pass through all the components of the netlist, thereby enabling the capacitance value optimizer to make bigger capacitance adjustments during the first couple of passes and to make smaller adjustments during later passes.

Input Nodes with Fanout Greater Than One.

Referring back to step 324 of the above described process, there is one situation in which the system cannot simply shift a time delay of ΔT from a component's output node to its input nodes. This is the situation in which an input node has a fanout greater than 1—i.e., where an input node is also coupled to the input port of at least one other component. The problem here is that adding a time delay of ΔT to this node may violate a timing constraint because it may add a time delay of ΔT to more than one timing path in the circuit.

The solution used in the preferred embodiment is as follows. First, while a time delay of ΔT is still subtracted from the output node(s) of the component being processed and a time delay of ΔT is still added to input nodes with a fanout equal to 1, no time delay is added to those input nodes which have a fanout greater than 1. Instead, these input nodes will receive special processing later, as will be described next. For the purposes of determining whether the time shift of ΔT should be retained for the current component (steps 326–330), each input node with a fanout greater than 1 is temporarily given an additional delay of ΔT/N, where ΔT is the time delay subtracted from the component's output node and N is the fanout of the input node. Since each input node may have a different fanout, different temporary time delays may be added to different ones of the input nodes.

It should be noted that an "input node" of one component is usually an output node of another circuit (unless it is an input to the entire circuit). To compensate for the fact that no time delay was added to such a node during processing of the components to which the node was an input, step 324 is modified as follows. Before shifting time delays from output nodes to input nodes, the amount of time delay for each output node with a fanout greater than 1 is first increased to its maximum possible value consistent with the circuit's timing constraints. Then the system performs the time delay shift as described above. In this way, the proper amount of time delay for nodes with fanouts greater than one is restored (i.e., the assigned maximum capacitance values for such nodes are readjusted). Time delays for inputs to the entire circuit which have fanouts greater than 1 are adjusted at the end of the component processing loop (after step 334 and before step 336) to their maximum possible value.

Another way to handle a component's input nodes that have a fanout greater than 1 would be to scan all the components having input ports coupled to the common input node, to determine the minimum ΔT time delay shift that will be performed forthose components, and then add that minimum ΔT time delay value to the input node. In this way one is assured that the time delay value added to the input node will not violate any timing constraints—but at the cost of additional computational processing.

ALTERNATE EMBODIMENTS

Another theoretically possible method of adjusting the timing delays so as to minimize the difficulty of laying out a circuit would be to use standard nonlinear programming techniques. In this case, the equations would comprise the layout difficulty equation and all the timing constraints as applied to each node of the circuit. However, this technique would be totally impractical for a circuit with even a few hundred nodes.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of improving the timing performance of an integrated circuit, the steps of the method comprising:
    receiving and storing in a computer memory a netlist denoting a list of components in said integrated circuit and a set of nodes interconnecting said components; each said component of said integrated circuit having at least one input port and at least one output port, said set of nodes including a set of circuit input nodes and circuit output nodes for said integrated circuit;
    receiving and storing in a computer memory a plurality of timing constraints corresponding to said set of nodes interconnecting said components of said integrated circuit, each of said timing constraints including a first node and a second node of said circuit and a maximum delay for a signal to propagate from said first node to said second node;
    determining capacitance values for said nodes of said circuit so as to meet said timing constraints; and
    passing said netlist and capacitance values to a silicon compiler and automatically placing/routing a circuit having said components and interconnection nodes with capacitance values not exceeding said capacitance values so as to meet said timing constraints.

2. The method of claim 1 wherein said determining step includes computing said capacitance values so as to minimize a routing difficulty value.

3. The method of claim 2 wherein said routing difficulty value comprises a sum of routing difficulty values associated with each of said nodes in said integrated circuit.

4. A method of improving the timing performance of an integrated circuit, the steps of the method comprising:
    receiving and storing in a computer memory a netlist denoting a list of components in said integrated circuit and a set of nodes interconnecting said components; each said component of said integrated circuit having at least one input port and at least one output port, said set of nodes including a set of circuit input nodes and circuit output nodes for said integrated circuit;
    assigning an initial capacitance value to each said node;
    computing a routing difficulty value, comprising a sum of routing difficulty values associated with each of said nodes in said integrated circuit;
    adjusting said capacitance values for said integrated circuit so as to reduce said computed routing difficulty value;
    altering said capacitance values of said nodes so as to meet timing constraints; and
    passing said netlist and adjusted capacitance values to a silicon compiler and automatically placing/routing a circuit having said components and interconnection nodes with capacitance values not exceeding said adjusted capacitance values.

5. The method of claim 4 further including:
    repeating the following steps until changes in said computed routing difficulty value meet predefined criteria:
        selecting one of said components;
        decreasing said time delay and maximum capacitance value associated with a node coupled to an output port of said component and increasing by corresponding amounts said time delay and maximum capacitance value associated with nodes coupled to input ports of said component;
        recomputing said routing difficulty value; and
        retaining said changed time delay and maximum capacitance values only if said recomputed routing difficulty value is smaller than its previous value.

6. A computer aided design system for improving the timing performance of an integrated circuit, comprising:
    first input means and storage means for receiving and storing in a computer memory a netlist denoting a list of components in said integrated circuit and a set of nodes interconnecting said components; each said component of said integrated circuit having at least one input port and at least one output port, said set of nodes including a set of circuit input nodes and circuit output nodes for said integrated circuit;
    second input means and storage means for receiving and storing in a computer memory a plurality of timing constraints, each of said timing constraints including a first node and a second node of said circuit and a maximum delay for a signal to propagate from said first node to said second node;
    means for determining capacitance values for individual nodes of said nodes of said circuit so as to meet said timing constraints; and
    means for passing said netlist and capacitance values to a silicon compiler for automatically placing/routing a circuit having said components and interconnection nodes with capacitance values not exceeding said capacitance values.

7. The apparatus of claim 6 wherein said determining means includes means for computing said capacitance values so as to minimize a routing difficulty value.

8. The apparatus of claim 7 wherein said routing difficulty value comprises a sum of routing difficulty values associated with each of said nodes in said integrated circuit.

9. A computer aided design system for improving the timing performance of an integrated circuit, comprising:
    input means and storage means for receiving and storing in a computer memory a netlist denoting a list of components in a specified integrated circuit and a set of nodes interconnecting said components; each said component of said specified integrated circuit having at least one input port and at least one output port, said set of nodes including a set of circuit input nodes and circuit output nodes for said specified integrated circuit;

initial value assignment means, coupled to said storage means, for assigning an initial capacitance value to each said node;

layout difficulty function means for computing a routing difficulty value, comprising a sum of routing difficulty values associated with each of said nodes in said specified integrated circuit;

means for adjusting said capacitance values for said specified integrated circuit so as to reduce said computed routing difficulty value;

means for altering said capacitance values so as to meet timing constraints; and means for passing said netlist and adjusted capacitance values to a silicon compiler to automatically place/route a circuit having said components and interconnection nodes with capacitance values not exceeding said adjusted capacitance values.

10. The computer aided design system of claim 9 further including:

optimization means, coupled to said initial value assignment means, said storage means, and said layout difficulty function means for repeatedly:

selecting one of said components;

decreasing said time delay and maximum capacitance value associated with a node coupled to an output port of said component and increasing by corresponding amounts said time delay and maximum capacitance value associated with nodes coupled to input ports of said component;

calling said layout difficulty function means to recompute said routing difficulty value; and retaining said changed time delay and maximum capacitance values only if said recomputed routing difficulty value is smaller than its previous value;

whereby said maximum capacitance values for said specified integrated circuit are automatically adjusted so as to reduce the difficulty of routing connections between said specified integrated circuit's components.

* * * * *